United States Patent
Venkatraman et al.

[11] Patent Number: 5,814,557
[45] Date of Patent: *Sep. 29, 1998

[54] METHOD OF FORMING AN INTERCONNECT STRUCTURE

[75] Inventors: Ramnath Venkatraman; Elizabeth J. Weitzman; Robert W. Fiordalice, all of Austin, Tex.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 650,560

[22] Filed: May 20, 1996

[51] Int. Cl.$^6$ .............................. H01L 21/4763
[52] U.S. Cl. ............... 438/622; 438/626; 438/627; 438/629; 438/633; 438/638; 438/643; 438/660; 438/666
[58] Field of Search ................... 438/622, 625, 438/627, 687, 626, 629, 633, 634, 637, 638, 640, 642, 643, 645, 648, 653, 660, 666, 669

[56] References Cited

U.S. PATENT DOCUMENTS

| | | | |
|---|---|---|---|
| 3,879,840 | 4/1975 | Ames et al. | 29/589 |
| 4,489,482 | 12/1984 | Keyser et al. | 29/591 |
| 4,789,648 | 12/1988 | Chow et al. . | |
| 4,962,058 | 10/1990 | Cronin et al. . | |
| 4,999,160 | 3/1991 | Lowrey et al. | 420/529 |
| 5,019,531 | 5/1991 | Awaya et al. | 438/687 |
| 5,240,880 | 8/1993 | Hindman et al. | 438/660 |
| 5,262,354 | 11/1993 | Cote et al. | 438/645 |
| 5,266,516 | 11/1993 | Ho | 438/627 |
| 5,284,799 | 2/1994 | Sato | 438/628 |
| 5,300,307 | 4/1994 | Frear et al. | 427/96 |
| 5,342,806 | 8/1994 | Asahina | 438/687 |
| 5,391,517 | 2/1995 | Gelatos et al. | 438/687 |
| 5,447,887 | 9/1995 | Filipiak et al. | 438/687 |
| 5,451,551 | 9/1995 | Krishnan et al. | 438/626 |
| 5,527,739 | 6/1996 | Parrillo | 438/627 |
| 5,565,707 | 10/1996 | Colgan et al. | 257/762 |
| 5,612,254 | 3/1997 | Mu et al. | 438/634 |
| 5,633,199 | 5/1997 | Fiordalice et al. | 438/642 |
| 5,658,828 | 8/1997 | Lin et al. | 438/627 |

OTHER PUBLICATIONS

S. Sun et al., "Performance of MOCVD Tantalum Nitride Diffusion Barrier for Copper Metallization," 1995 Symposium on VLSI Technology Digest of Technical Papers, pp. 29–30.

*Primary Examiner*—Olik Chaudhuri
*Assistant Examiner*—Lynne A. Gurley

[57] ABSTRACT

An interconnect structure (10) is formed by filling a dual damascene structure (12) with conductive material. A barrier layer (13) is formed to serve as a seed layer and to prevent the out diffusion of copper. A first conductive layer (14) is formed to fill a first portion (21) of the damascene structure (12). A second conductive layer (16) is then formed to complete the filling of a second portion (22) of the damascene structure. A polishing process is then used to remove any excess material.

7 Claims, 1 Drawing Sheet

METHOD OF FORMING AN INTERCONNECT STRUCTURE

Related subject matter is disclosed in commonly assigned U.S. Pat. No. 5,677,244.

BACKGROUND OF THE INVENTION

The present invention is related to a co-pending application Ser. No. 08/650,506 that was filed concurrently herewith and is assigned to the same assignee as the present invention.

This invention relates, in general, to interconnect structures, and more particularly to interconnect structures used to electrically couple portions of semiconductor devices.

Traditionally, electrical interconnect between two conductors in a semiconductor device has been provided by a plug structure such as a tungsten plug; for example, electrical connection between a first and second metal lines or between a first metal line and the a local interconnect wiring level etc. Such structures require three separate processing steps; one for the formation of each of the two conductors and one for the formation of the tungsten plug structure. Consequently, dual damascene structures have been developed to simplify the process steps required to form electrical interconnect structures.

A dual damascene structure has a bottom portion that contacts an underlying conductor and replaces the functionality of a plug structure in a traditional interconnect structure. The dual damascene structure also has a top portion that is an inlaid trench structure that is used for the formation of a second conductor. Because the bottom and top portions of a dual damascene structure are in contact with each other, they can be filled simultaneously with the same conductive material. This obviates the need to form a plug structure and an overlying conductive layer in separate processing steps.

The difficulty in filling dual damascene structures usually lies in filling the narrow bottom portion without the formation of key holes, or filling the top portion such that an even and planar surface is formed. Two previously known methods for filling the portions of the dual damascene structure are the force fill technique and ionized magnetron sputtering. The force fill technique uses pressure applied to a conductive material to fill the bottom portion of the damascene structure. However, this technique is not effective for filling long, wide trench structures evenly. The top portion of the damascene structure can be used as a power supply line that might be 10 to 50 microns wide. Applying pressure to wide features area can result in an uneven fill of the damascene structure. Ionized magnetron sputtering on the other hand, is not widely used in manufacturing operations because the process is not very planar and it is difficult to control the fill capability across a semiconductor substrate.

By now it should be appreciated that it would be advantageous to provide a technique for filling an interconnect structure with a conductive material. It would also be advantageous if the method provided an interconnect structure that had improved electromigration resistance compared to conventional interconnect structures.

DETAILED DESCRIPTION OF THE DRAWINGS

The present invention provides a method of filling a dual damascene structure or other interconnect structure using low temperature processing. All of the process steps used to form the interconnect structure are performed below about 400° C. Because of this relatively low temperature processing, the present invention can be used in conjunction with other materials and processes used in the semiconductor industry, such as low dielectric constant materials. The process for forming the interconnect structure includes the formation of a conductive layer that contains copper. An anneal step is then performed to distribute the copper throughout the interconnect structure. The presence of copper will retard electromigration and improve the overall reliability of the interconnect structure.

Figure 1:
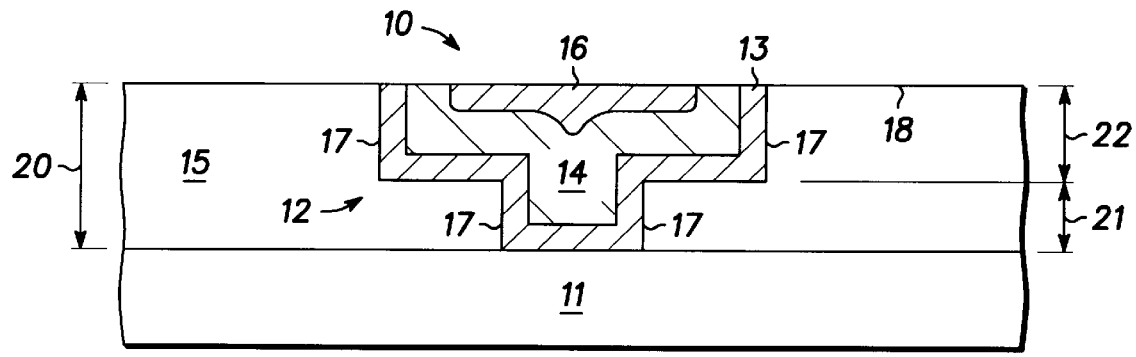
FIG. 1 is an enlarged cross-sectional view of an interconnect structure in accordance with the present invention.

Turning now to FIG. 1, a detailed description of the present invention is provided. FIG. 1 is an enlarged cross-sectional view of an interconnect structure 10 that is formed in a dual damascene structure 12. Damascene structure 12 is formed in a dielectric layer 15 and comprises two regions, namely a first portion 21 and a second portion 22. First portion 21 is in contact with a first conductor 11 and second portion 22 represents a second conductor. For example, first conductor 11 could be a metal one line and second portion 22 can perform the function of an overlying metal two line. First portion 21, therefore, provides an electrical connection between first conductor 11 and second portion 22 of damascene structure 12.

Interconnect structure 10 comprises a barrier layer 13, which acts as an adhesion layer and retards the out diffusion of copper into dielectric layer 15. First portion 21 of damascene structure 12 is filled with a first conductive layer 14, which simultaneously fills part of second portion 22. The rest of second portion 22 is filled with a second conductive layer 16 that has a copper concentration. The copper concentration in second conductive layer 16 is used to dope first conductive layer 14 to improve the electromigration resistance of interconnect structure 10.

Figure 2:
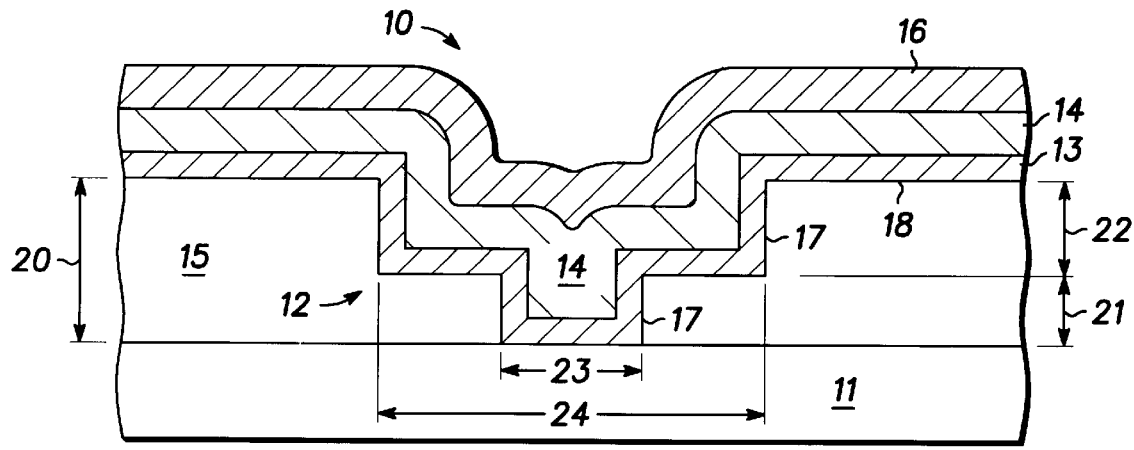
FIG. 2 is an enlarged cross-sectional view of the interconnect structure of FIG. 1 at an intermediate point in fabrication.

Referring now to FIG. 2, a method for forming interconnect structure 10 is provided. Dielectric layer 15 is formed on first conductor 11 using well known deposition techniques such as the chemical vapor deposition of silicon dioxide using tetraethylorthosilicate. Two sequential photolithographic and reactive ion etch techniques are then used to remove portions of dielectric layer 15 to form damascene structure 12 as shown in FIG. 2. The etch process will form first portion 21 and second portion 22 of damascene structure 12 such that they have a width 23 and a width 24, respectively. Damascene structure 12 will have an aspect ratio that is defined as the height of first portion 21 and second portion 22 (shown as height 20) divided by the width 23 of first portion 21. Preferably, the aspect ratio of damascene structure 12 is greater than about 3.5.

The dimensions of damascene structure 12 can vary depending on the electrical requirements of interconnect structure 10. For example, second portion 22 can be very wide such as 20 microns to provide a large current carrying capability or can be relatively small such as 0.1 microns to conserve space within a semiconductor device. Width 23 of first portion 21 is generally limited to the photolithographic processing capability and the ability of the following process steps to completely fill in first portion 21. For example, first portion 21 can be about 0.1 microns to 3 microns wide.

After the formation of damascene structure 12, barrier layer 13 is formed along the sides 17 of damascene structure 12 and the top surface 18 of dielectric layer 15. Barrier layer 13 can be formed using a variety of techniques such as sputtering, evaporation, chemical vapor deposition (CVD), or plasma enhanced chemical vapor deposition (PECVD). Barrier layer 13 is about 25 angstroms to 4000 angstroms thick and can comprise a variety of materials such as titanium, titanium nitride, copper, and aluminum. Preferably, the process used to form barrier layer 13 does not exceed 400° C. during deposition.

Barrier layer 13 acts as a seed layer for the formation of first conductive layer 14. First conductive layer 14 is formed with a chemical vapor deposition process using the decomposition of dimethylaluminumhydride (DMAH). Using a CVD process, first conductive layer 14 fills first portion 21 of damascene structure 12 and conforms to the sides 17 of second portion 22. It should be understood that first conductive layer 14 can comprise materials other than aluminum such as copper or copper alloys, and first conductive layer 14 is preferably formed at a temperature below about 400° C. The formation of first conductive layer 14 using the CVD process described above can be performed at 180° C. to 350° C.

Second conductive layer 16 is then formed on first conductive layer 14 using a plasma vapor deposition (PVD) process. Preferably, second conductive layer 16 is an aluminum film that has a copper concentration of about 0.1 percent to 12 percent. Traditionally, this process is performed at about 200° C. However, to reduce the chance of a key hole forming, this process is performed at about 280° C. to 400° C. Thus second conductive layer 16 can be formed at a temperature below about 400° C. The PVD sputtering process will fill second portion 22 of damascene structure 12 with conductive material, which can serve as an electrical interconnect layer that is electrically coupled to first conductor 11 by first portion 21.

Following the formation of second conductive layer 16, an anneal step may be performed to drive some of the copper in second conductive layer 16 into the rest of interconnect structure 10. Preferably, the anneal step is performed in an inert ambient such as hydrogen and nitrogen and is performed at a temperature below about 400° C. such as 150° C. to 390° C. An anneal less than about 2 hours should be adequate. It should be understood that the copper concentration, the anneal temperature, and the anneal time can be varied to control the distribution of copper throughout interconnect structure 10. The anneal step may also be omitted if the temperatures of subsequent processing to a semiconductor device the employs interconnect structure 10 are sufficient to drive the copper into first conductive layer 14.

Referring back now to FIG. 1, a polishing process is used to remove the excess portions of barrier layer 13, first conductive layer 14, and second conductive layer 16 on the top surface 18 of dielectric layer 15. A mechanical or a chemical and mechanical polish (CMP) process is used to physically remove the excess material and define interconnect structure 10. After the polishing process, interconnect structure 10 has a metal line formed in a trench, second portion 22, that is electrically coupled to first conductor 11 by a via-like structure of first portion 21.

Figure 3:
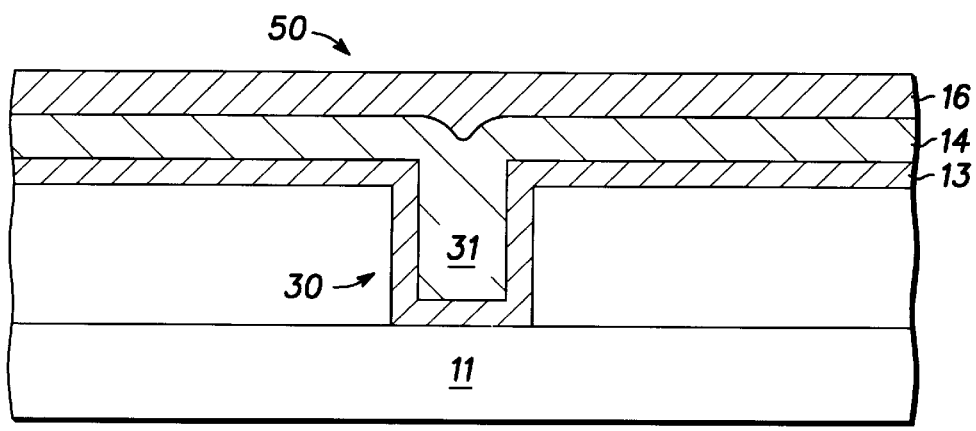
FIG. 3 is an enlarged cross-sectional view of an alternate interconnect structure in accordance with the present invention.

FIG. 3 is an enlarged cross-sectional view of an interconnect structure 50 in accordance with an alternate embodiment of the present invention. Instead of filling a dual damascene structure 12 (see FIG. 1), the method of the present invention can also be used to fill a single via opening 30. In this embodiment, barrier layer 13, first conductive layer 14, and second conductive layer 16 are used to form a via-like region 31. Barrier layer 13, first conductive layer 14, and second conductive layer 16 can then be patterned using conventional photolithographic and etch techniques to form an overlying conductor such as a metal line (not shown).

One of the many advantages of interconnect structure 10 of the present invention is that the processes used to form barrier layer 13 and first conductive layer 14 are very conformal. Therefore, the present invention can be used to fill damascene structures that have high aspect ratios such as aspect ratios greater than five. In addition, all of the above mentioned processes can be performed below 400° C. This allows interconnect structure 10 to be used as part of a multi-level metallization scheme in complex semiconductor devices with reduced risk of damaging other portions of the semiconductor devices due to the thermal stress of elevated temperatures. Finally, the present invention provides a method of alloying an aluminum via region to improve the overall electromigration resistance of the interconnect structure 10 or 50.

By now it should be appreciated that the present invention provides a method for forming an interconnect structure with improved fill characteristics compared to some previously known techniques. The method can be performed below 400° C. to reduce the exposure of neighboring structures to high temperature processing. The present invention also provides a method for doping an aluminum layer with copper to improve the reliability of the interconnect structure.

We claim:

1. A method of filling an interconnect structure, wherein the interconnect structure has sides, the method comprising the steps of:

providing the interconnect structure wherein the interconnect structure has a top opening having a first dimension and a bottom opening having a second dimension, the first dimension being greater than the second dimension:

forming a barrier layer on the sides of the interconnect structure, wherein the barrier layer is formed at a temperature below about 400° C.;

forming a first conductive layer overlying the barrier layer and in the interconnect structure, wherein the first conductive layer comprises aluminum and is formed at a temperature below about 400° C.;

forming a second conductive layer overlying the first conductive layer and in the interconnect structure, wherein the second conductive layer comprises aluminum and copper and is formed at a temperature below about 400° C.; and annealing the second conductive layer at a temperature below about 400° C. so that copper from the second conductive layer is diffused into the first conductive layer, whereby none of the barrier layer, the first conductive layer, and the second conductive layer are ever exposed to a temperature greater than about 400° C. in the steps of forming and annealing:

polishing portions of all of the barrier layer, the first conductive layer, and the second conductive layer together to form a conductive interconnect structure which contains portions of all of the barrier layer, the first conductive layer, and the second conductive layer as part of the conductive interconnect structure.

2. The method of claim 1 wherein the step of annealing the second conductive layer is performed using an ambient that comprises an inert gas.

3. The method of claim 1 wherein the interconnect structure has an aspect ratio greater than about 3.5 via the first dimension and the second dimension.

4. The method of claim 1 wherein the barrier layer comprises a material selected from the group consisting of titanium, titanium nitride, copper, and aluminum.

5. The method of claim 1 wherein the second conductive layer has a copper concentration of about 1 percent to 12 percent copper by weight.

6. The method of claim 1 wherein the second conductive layer is formed from a plasma vapor deposition process.

7. The method of claim 1 wherein the first conductive layer is placed into direct contact with the second conductive layer whereby no barrier region separates the first conductive layer and the second conductive layer.

* * * * *